United States Patent [19]

Moy

[11] Patent Number: 4,697,105

[45] Date of Patent: Sep. 29, 1987

[54] CMOS PROGRAMMABLE LOGIC ARRAY

[75] Inventor: Thomas H. Moy, Allentown, Pa.

[73] Assignee: American Telephone and Telegraph Company, AT&T Bell Laboratories, Murray Hill, N.J.

[21] Appl. No.: 888,796

[22] Filed: Jul. 23, 1986

[51] Int. Cl.[4] .................. H03K 19/177; H03K 17/284
[52] U.S. Cl. ..................................... 307/465; 307/469; 307/443; 307/481; 307/594; 307/601; 307/605; 307/246; 364/716
[58] Field of Search ................ 307/443, 448, 451–452, 307/465, 468, 469, 481, 269, 592, 594, 595, 601, 603, 605, 606, 246; 364/716

[56] References Cited

U.S. PATENT DOCUMENTS

| 4,233,667 | 11/1980 | Devine et al. | 307/465 X |
| 4,488,229 | 12/1984 | Harrison | 364/716 X |
| 4,501,977 | 2/1985 | Koike | 307/481 X |
| 4,583,012 | 4/1986 | Smith et al. | 307/481 X |
| 4,611,133 | 9/1986 | Peterson et al. | 307/465 |

OTHER PUBLICATIONS

Leininger, "Universal Logic Module", IBM T.D.B., vol. 13, No. 5, Oct. 1970, pp. 1294–1295.

Primary Examiner—Stanley D. Miller
Assistant Examiner—D. R. Hudspeth
Attorney, Agent, or Firm—James H. Fox

[57] ABSTRACT

A programmable logic array includes a dynamic AND plane, and an OR plane using clocked load devices. The high precharge voltage state in the AND plane places the logic lines in the OR plane in a low voltage state during precharge. The OR logic lines may then be pulled to a high level during the decode operation. A single clock having a delay path may be used to control the precharge and decode operations of the PLA.

3 Claims, 1 Drawing Figure

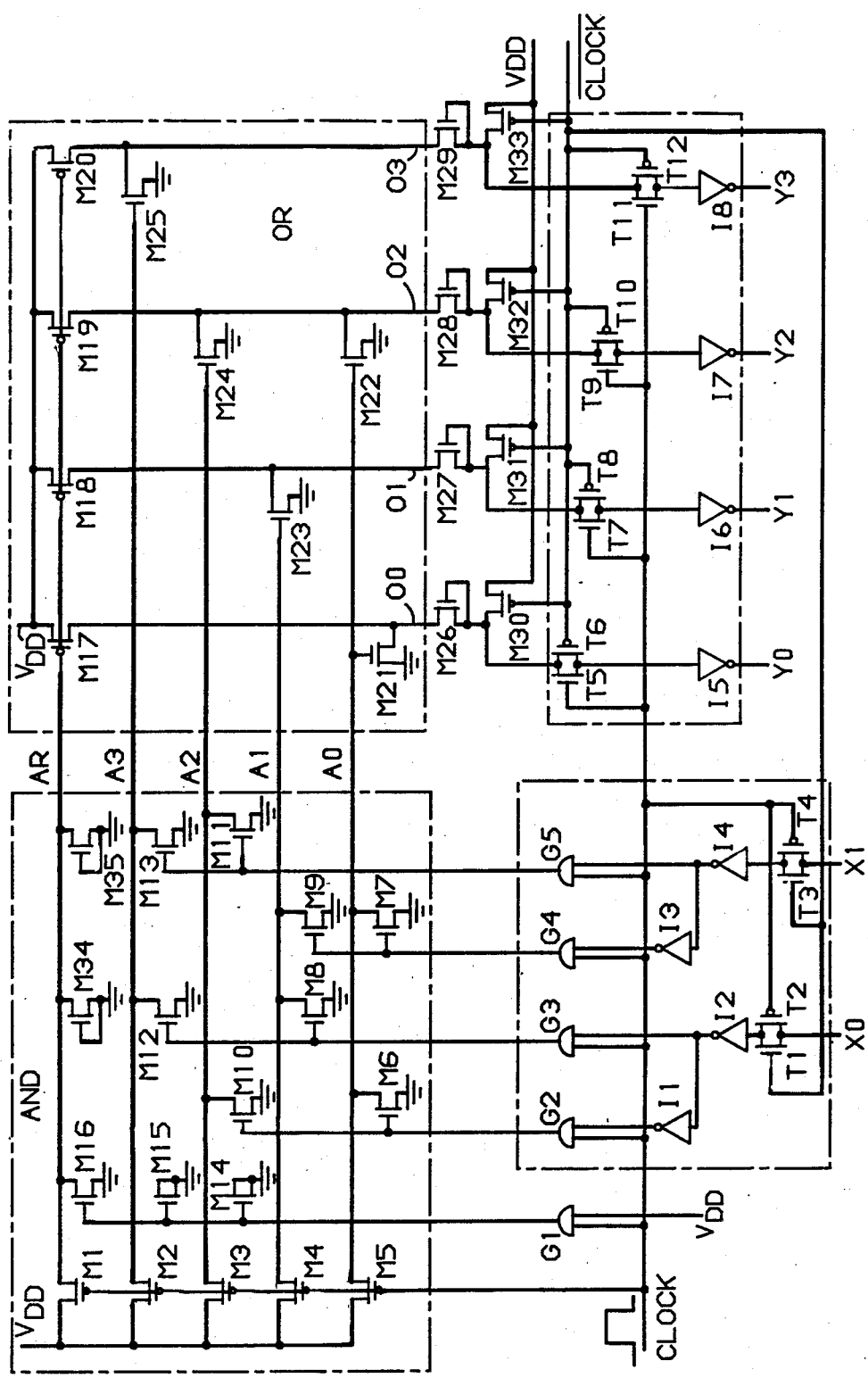

CMOS PROGRAMMABLE LOGIC ARRAY

BACKGROUND OF THE INVENTION

1. Field of the Invention

The present invention relates to an integrated circuit having a programmable logic array implemented in complementary (e.g. CMOS) technology.

2. Description of the Prior Art

A programmable logic array (PLA) implements a desired logical truth table by accepting a plurality of logical input signals and decoding them to provide a plurality of output signals. The decoding function is usually accomplished using two arrays of logic gates, referred to as the "AND" plane and the "OR" plane. The input signals are applied to the AND plane, which partially decodes them, and applies the intermediate results as inputs to the OR plane. The terms AND and OR are representative of the Boolean algebra operations that are typically performed in the respective arrays. However, electrically both of the arrays are usually similar, and comprise a series of signal line conductors whose voltage state represents the logical value of a given logic output term (OR plane), or intermediate result (AND plane).

The signal line conductors in both the AND and OR planes are precharged to a high voltage state in the case of a dynamic PLA. In the case of static PLA, they are connected to a load device that tends to continuously pull them up to a high voltage state. In either case, logic transistors are connected in a desired parallel pattern between the signal lines and a reference voltage (e.g., ground). Then, in order to perform a decoding operation, the input signals (or intermediate results) are applied to the control terminals of the logic transistors. If any of the logic transistors connected to a given signal line is thereby placed in the conductive state, that signal line is pulled down to the ground voltage state. Hence, electrically both the AND and OR planes perform a "NOR" operation.

The dynamic PLA design provides for low current consumption, since no dc current flows through the conductive logic transistors during a decode operation. However, clocks are required to switch between the precharge and decode operations for the AND and OR planes in a dynamic PLA. A first clock is applied to the AND plane, and a second clock delayed relative to the first is applied to the OR plane, so that the AND plane has sufficient time to complete its decode operation prior to performing the decode in the OR plane. The delay between the clocks must be sufficiently long to ensure that no erroneous discharge of a conductor occurs in the OR plane, since once discharged there is no further precharge signal available, and an erroneous output results. A disadvantage of using two clocks is that the circuit required for the clock signals does not readily fit in the area of either the AND or the OR plane, so that it is placed externally thereto. This complicates the layout of the integrated circuit, especially when computer aided design techniques that utilize geometrically regular blocks of circuitry are used.

It is known to use a static array for both the AND and OR planes, instead of a dynamic array. The static array eliminates the need for any clocks, since both planes are receptive to decode input signals whenever they arrive. However, a static array draws dc current whenever any of the logic transistors is in the "on" (i.e., conducting) state, and hence the power consumption is undesirably high for some applications.

It is therefore desirable to obtain a programmable logic array that obtains low power consumption and ease of layout.

SUMMARY OF THE INVENTION

I have invented a programmable logic array wherein the AND plane is a dynamic logic array, and the OR plane uses clocked load devices. During the precharge operation, the logic lines in the dynamic AND plane are precharged to a high voltage state, and the clocked load devices in the OR plane are turned off. This ensures that the logic lines in the OR plane are set to a low voltage state during precharge. During the decode operation, the clocked load devices in the OR plane are turned on, allowing the decoding to be completed. The clock for the OR plane may be readily derived by a delay line in the AND plane.

BRIEF DESCRIPTION OF THE DRAWING

The FIGURE shows schematically an embodiment of the present invention.

DETAILED DESCRIPTION

The following detailed description relates to a programmable logic array that allows a simplified layout, while obtaining low power consumption.

Referring to the FIGURE, a clock signal (CLOCK) is applied to the gates of p-channel precharge transistors M1-M5. The clock itself (not shown) may be on the same integrated circuit as the PLA, or may be located externally thereto. When the clock is low, the PLA is in the precharge mode. In precharge mode, all of the p-channel devices (M1 ... M5) connected to VDD and the AND plane lines (AR ... AO) are turned on, due to the low clock voltage on their gates. Furthermore, since the clock is low, all of the outputs of the AND driver gates (G1 ... G5) are held low, and thus all of the n-channel transistors (M6 ... M16) in the AND plane are off (i.e., non-conducting). As a result, all of the AND plane logic lines (A0 ... A3) are precharged high (to VDD), as is the AND plane reference delay line (AR). With the AND plane logic lines (A0 ... A3) being all high, all of the n-channel logic transistors (M21 ... M25) in the OR plane are on. In addition, since the AND plane reference line (AR) is high, all of the p-channel clocked load transistors (M17 ... M20) connected to VDD and the OR plane logic lines (O0 ... O3) are off. As as result, all of the OR plane logic lines, O0 ... O3, are at ground potential (VSS) during precharge. Since CLOCK is low, and $\overline{CLOCK}$ high, during precharge, the input transmission gates T1 ... T4 are conducting. This allows the logic input signals X0, X1 to pass to the inputs of inverters I1 ... I4, where they are capacitively stored. The inverter outputs are then applied to the inputs of driver gates G2 ... G5; the outputs of the driver gates then control the logic transistors (M6 ... M13).

When the clock signal goes high, the PLA decodes the inputs (X0-X1) to produce the output signals (Y0 ... Y3). The illustrative circuit implements the logic function $Y0 = \overline{X0} \cdot \overline{X1}$, $Y1 = X0 \cdot \overline{X1}$; $Y2 = \overline{X0} \cdot \overline{X1} + \overline{X0} \cdot X1$; and $Y3 = X0 \cdot X1$. This is accomplished in the following manner: The clock going high turns off the p-channel precharge transistors (M1 ... M5) connected to the AND plane lines (AR ... AO). The high clock signal also causes the output of G1 to go high, as well as the output of one input driver gate in each pair (G2–G3 and G4–G5). Which of the input driver gates goes high depends on whether the input (X0,X1) to the given pair was high or low when the clock was low. During the decode operation, the AND plane logic lines (A0 ... A3) which are connected to one or more n-channel logic transistors (M6 ... M13) that are turned on by an AND driver gate going high are discharged to VSS through the one or more logic transistors. Those logic lines in the AND plane that remain precharged high are considered to be in the "true" state.

The AND plane reference delay line AR will always discharge to VSS through an n-channel device (M16), which is turned on by the reference AND driver gate (G1). The reference AND driver gate goes high whenever the clock is high, and also drives dummy n-channel transistors (M14, M15). These dummy devices serve to capacitively load the reference driver gate G1 so as to match the worst case loading seen by any of the input driver gates (G2 ... G5). Similarly, dummy n-channel transistors (M34, M35) serve to capacitively load the AND plane reference delay line AR so as to match the worst case loading seen by any of the AND plane logic lines A0 ... A3. Therefore, AR will discharge to VSS no sooner than any of the AND plane logic lines A0 ... A3. The AR line discharging low turns on the p-channel load transistors (M17 ... M20) connected to VDD and the OR plane logic lines (O0–O3). Since the signal on the AR line is derived (and delayed) from the clock signal, the load transistors M17 ... M20 are considered herein to be clocked load transistors.

When in the decode state, the clocked load transistors tend to pull the logic lines in the OR plane toward a high voltage state. Which of the OR logic lines are pulled high, and which remain low, is a function of the AND plane logic line decoding. For those OR plane logic lines which are a function of AND plane logic lines that have all decoded false (i.e., discharged to VSS), the corresponding n-channel transistors in the OR plane are turned off, and those OR plane logic lines are allowed to be pulled high by their p-channel clocked load transistors. On the other hand, for those OR plane logic lines which are a function of at least one AND plane logic line that has decoded true (i.e., remain precharged to VDD), the corresponding n-channel transistor in the OR plane remains on. The on-impedance of the n-channel transistors in the OR plane (M21 ... M25) is chosen to be sufficiently less than the on-impedance of the p-channel load transistors so that the true OR plane logic lines remain at a low voltage level (though not at VSS) as dc current flow occurs. Note that the dc current flow occurs only when the PLA is in the decode state, and hence the power dissipation remains relatively low as compared to static designs.

Deriving the OR plane clock by a delay line from the AND plane clock is hence very advantageous. However, the amount of delay is optional insofar as the present invention is concerned. That is, if there were no delay in the clock signal applied to the OR plane, the PLA would still decode properly, unlike the case of PLA's having a dynamic OR plane. However, power dissipation is increased somewhat in the case of no delay, since both the clocked load transistors and all of the logic transistors in the OR plane are on simultaneously for a brief period. Providing sufficient delay so that the AND plane logic lines reach their decoded voltage level before the clocked load devices in the OR plane are turned on eliminates that component of the power consumption. An intermediate level of delay produces an intermediate power consumption.

The OR plane lines O0 ... O3 connect to optional output latching circuitry that may also be controlled by the clock. Clocked p-channel transistors M30–M33 serve to bias n-channel transistors M26–29, which provide for a small positive offset voltage, equal to the threshold voltages of diode-connected transistors M26–M29. This speeds up the rise of positive-going output signals. The output signals on lines O0 ... O3 are then applied to a dynamic output latch that includes clocked transmission gates T5–T12; when CLOCK is high (and $\overline{CLOCK}$ is low), the transmission gates allow the output signals to pass to inverters I5–I8, producing the desired output terms Y0 ... Y3. Still other types of output circuitry may be provided as desired.

Note that the foregoing description has illustratively been given for n-channel logic transistors and p-channel precharge and load transistors, as is typical with CMOS technology. However, the opposite conductivity types are possible for these functions. In that case, the term "high" as applied to a voltage level refers to the more negative voltage level, and term "low" then refers to the more positive voltage level.

What is claimed is:

1. An integrated circuit comprising a programmable logic array having an AND plane and an OR plane, wherein said AND plane includes conductive AND logic lines (A0 ... A3) and precharge transistors (M5 ... M2) controlled by a clock for charging the AND logic lines to a high voltage level, and said OR plane includes conductive OR logic lines (O0 ... O3) and load transistors (M17 ... M20) for pulling the OR logic lines toward a high voltage level, CHARACTERIZED in that said AND plane further comprises a conductive delay line (AR) that is directly connected to the control electrodes of said load transistors in the OR plane, and charged to a high voltage level by a precharge transistor (M1) when said clock is in a first state, and discharged to a low voltage level by a discharge transistor (M16) when said clock is in a second state, and still further comprises at least one capacitive load transistor (M14,M15) connected to the control electrode of said discharge transistor, and at least one capacitive load transistor (M34,M35) connected to said delay line.

2. The integrated circuit of claim 1 further comprising input drivers (G2 ... G5) connected to logic transistors (M6 ... M13) in said AND plane, and wherein the number of the capacitive load transistors connected to the control electrode of said discharge transistor is sufficient to match the worst case loading seen by any of said input drivers.

3. The integrated circuit of claim 1 wherein the number of capacitive load transistors connected to said delay line is sufficient to match the worst case loading seen by any of said AND logic lines.

* * * * *